United States Patent
Suzuki et al.

(10) Patent No.: US 9,012,987 B2
(45) Date of Patent: Apr. 21, 2015

(54) SEMICONDUCTOR DEVICE, PRINTING APPARATUS, AND MANUFACTURING METHOD THEREOF

(71) Applicant: Canon Kabushiki Kaisha, Tokyo (JP)

(72) Inventors: Nobuyuki Suzuki, Oita (JP); Satoshi Suzuki, Fujisawa (JP); Masanobu Ohmura, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 18 days.

(21) Appl. No.: 13/775,576

(22) Filed: Feb. 25, 2013

(65) Prior Publication Data
US 2013/0234248 A1 Sep. 12, 2013

(30) Foreign Application Priority Data
Mar. 6, 2012 (JP) ................ 2012-049717

(51) Int. Cl.
| | | |
|---|---|---|
| *H01L 29/66* | (2006.01) | |
| *H01L 21/82* | (2006.01) | |
| *H01L 27/092* | (2006.01) | |
| *H01L 21/8238* | (2006.01) | |

(52) U.S. Cl.
CPC .............. *H01L 21/82* (2013.01); *H01L 27/092* (2013.01); *H01L 21/823814* (2013.01); *H01L 21/82385* (2013.01); *H01L 21/823857* (2013.01); *H01L 27/0922* (2013.01)

(58) Field of Classification Search
CPC ...................................................... H01L 27/092
USPC ......................................................... 257/335
See application file for complete search history.

(56) References Cited

U.S. PATENT DOCUMENTS

| 4,887,142 | A | 12/1989 | Bertotti et al. ............. 257/338 |
| 6,855,985 | B2 | 2/2005 | Williams et al. ............ 257/338 |
| 6,894,350 | B2 | 5/2005 | Shimizu et al. ............. 257/343 |
| 2003/0155585 | A1* | 8/2003 | Kozuka et al. ............. 257/200 |
| 2004/0004263 | A1* | 1/2004 | Rothleitner ............... 257/500 |

FOREIGN PATENT DOCUMENTS

| CN | 101405867 | 4/2009 |
| JP | 2005-044924 | 2/2005 |
| JP | 2010-251624 | 11/2010 |

OTHER PUBLICATIONS

Office Action issued on Aug. 26, 2014, in counterpart Chinese patent application 201310069805.7, with translation.

* cited by examiner

*Primary Examiner* — Ajay K Arora
(74) *Attorney, Agent, or Firm* — Fitzpatrick, Cella, Harper & Scinto

(57) ABSTRACT

A manufacturing method of a semiconductor device including a DMOS transistor, an NMOS transistor and a PMOS transistor arranged on a semiconductor substrate, the DMOS transistor including a first impurity region and a second impurity region formed to be adjacent to each other, the first impurity region being of the same conductivity type as a drain region and a source region of the DMOS transistor, forming to enclose the drain region, and the second impurity region being of a conductivity type opposite to the first impurity region, forming to enclose the source region, the manufacturing method of the semiconductor device comprising forming the first impurity region and one of the NMOS transistor and the PMOS transistor, and forming the second impurity region and the other of the NMOS transistor and the PMOS transistor.

13 Claims, 7 Drawing Sheets

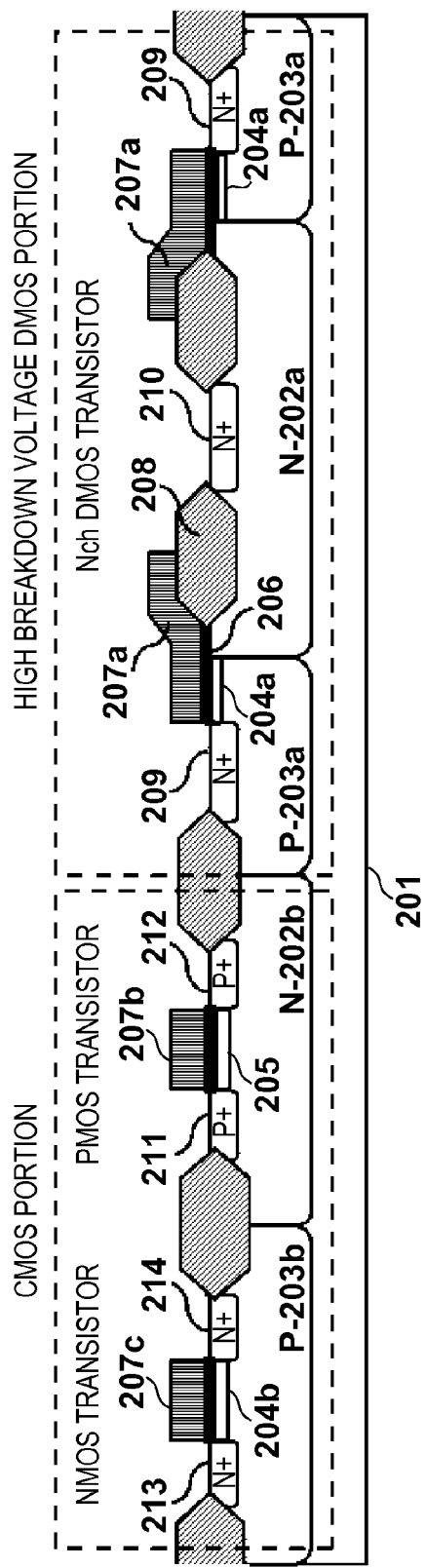
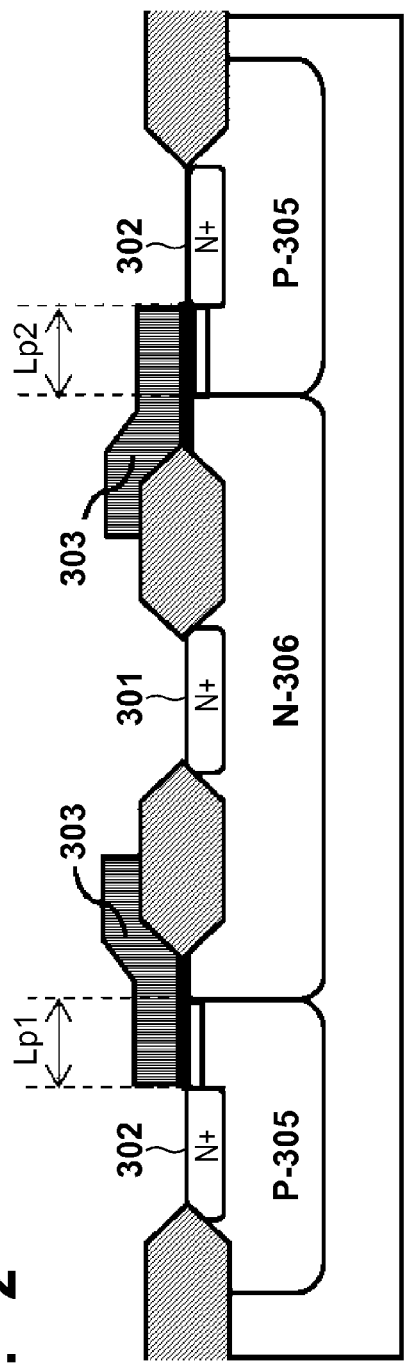

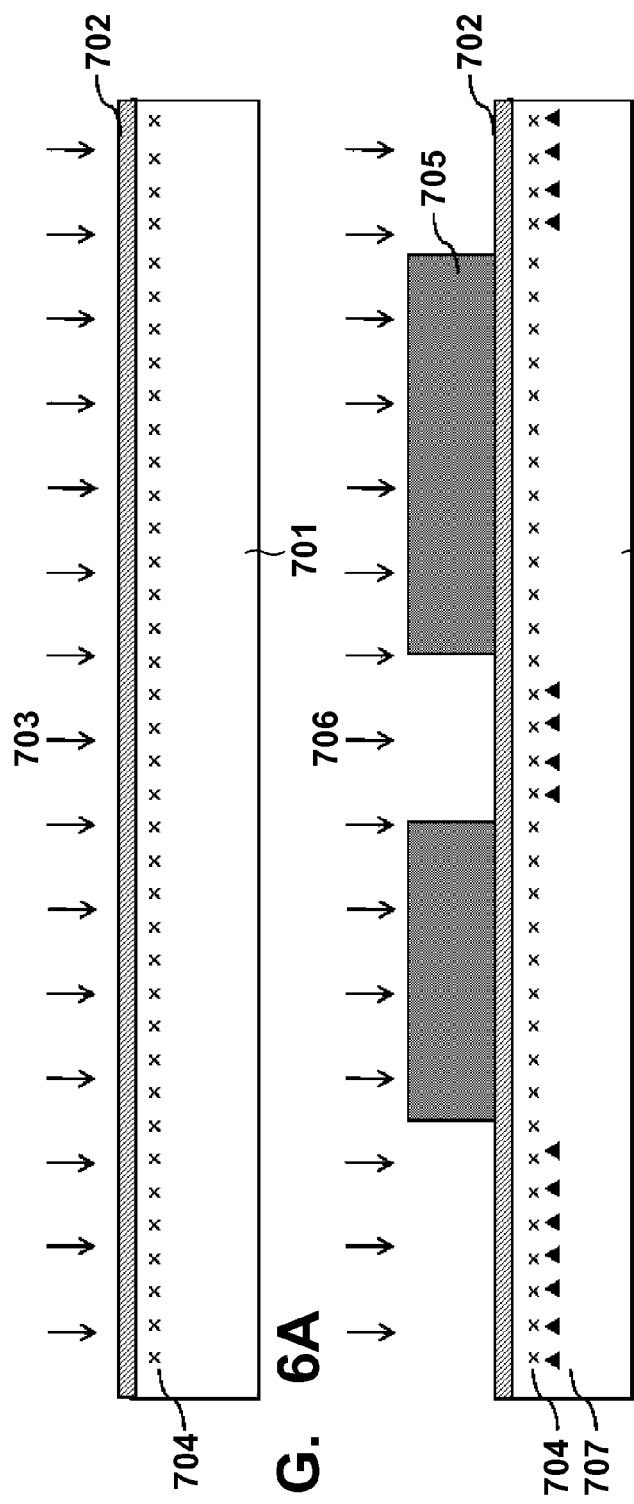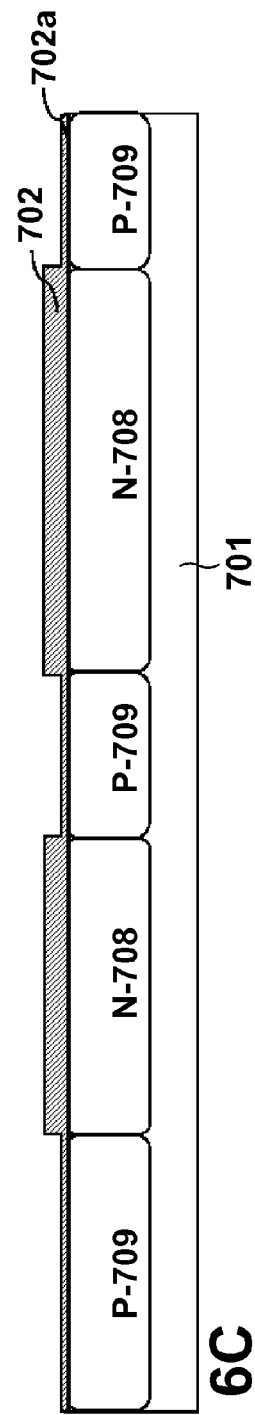
FIG. 6A
FIG. 6B
FIG. 6C

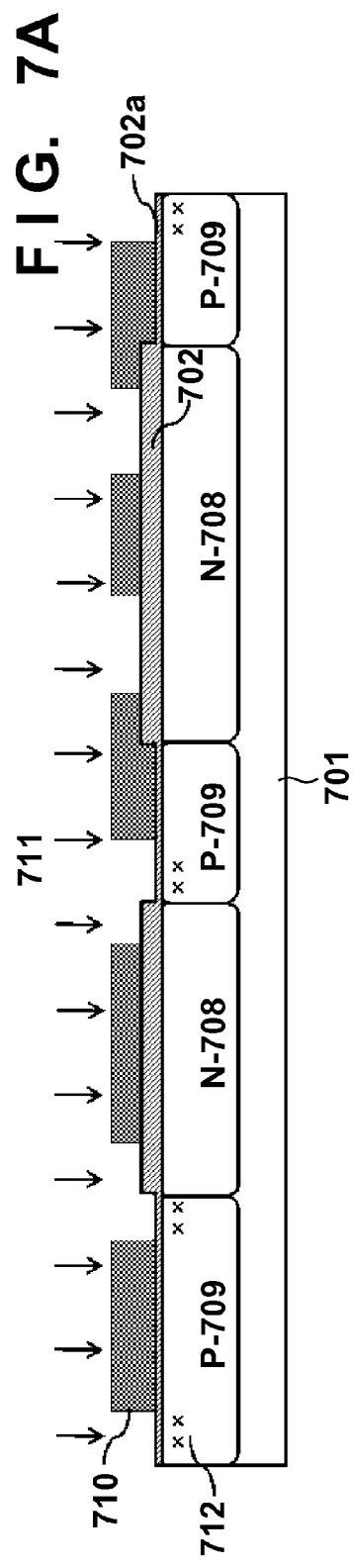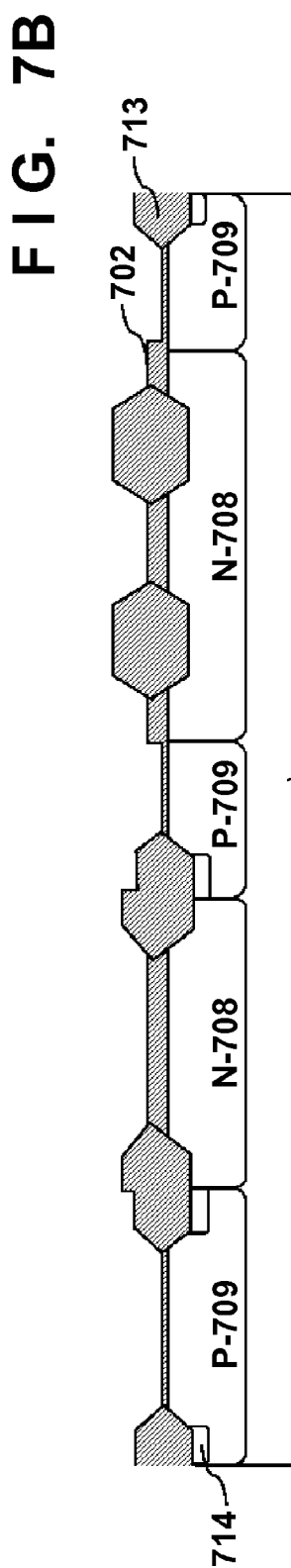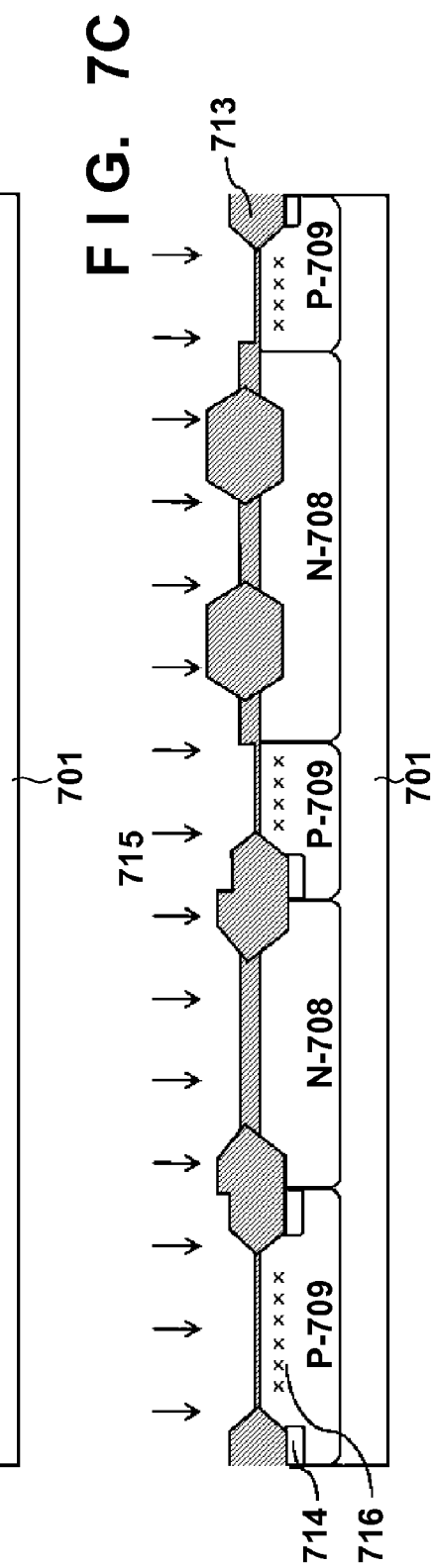

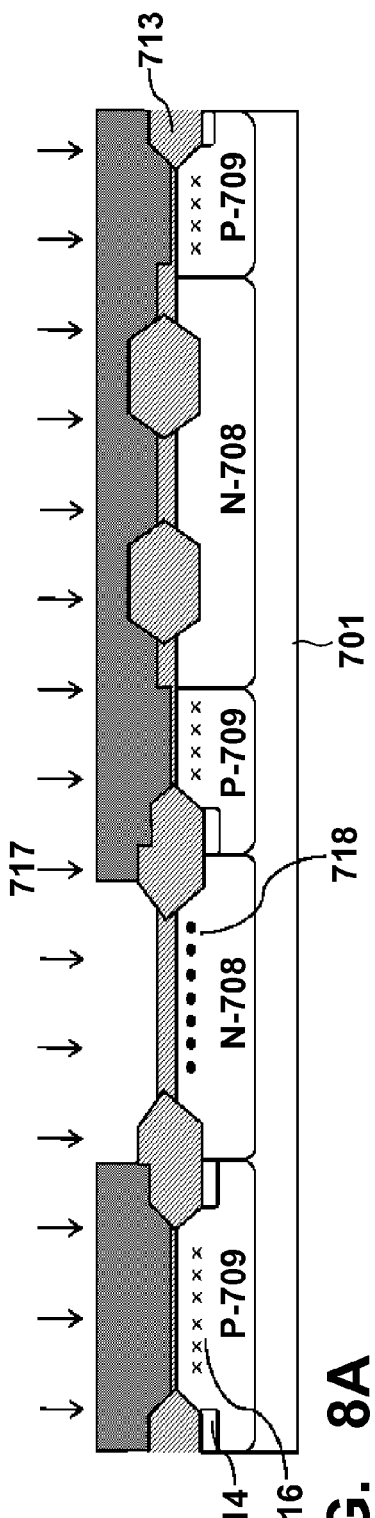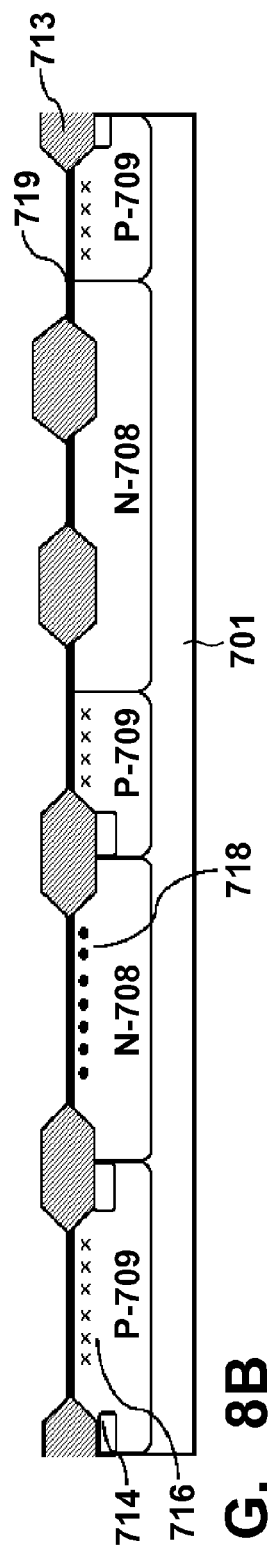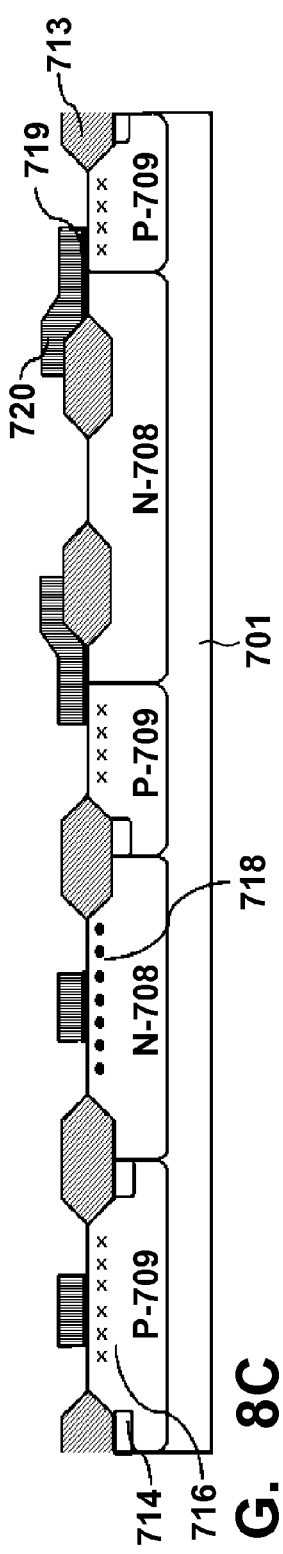

SEMICONDUCTOR DEVICE, PRINTING APPARATUS, AND MANUFACTURING METHOD THEREOF

BACKGROUND OF THE INVENTION

1. Field of the Invention

The present invention relates to a semiconductor device, a printing apparatus, and a manufacturing method thereof.

2. Description of the Related Art

In a semiconductor device, a DMOS transistor is used as a driver device that is driven by a high voltage to make a large current flow. For example, Japanese Patent Laid-Open Nos. 2005-44924 and 2010-251624 disclose techniques of forming a DMOS transistor and a CMOS transistor on the same semiconductor substrate.

According to Japanese Patent Laid-Open No. 2005-44924, a DMOS transistor is formed and then covered with a silicon nitride film, thereby separately forming a CMOS transistor. For this reason, the man-hour increases. According to Japanese Patent Laid-Open No. 2010-251624, side walls are selectively formed so as to simultaneously form the source and drain regions of a DMOS transistor and a CMOS transistor. However, man-hour reduction is not sufficient.

SUMMARY OF THE INVENTION

The present invention provides a technique advantageous in forming a DMOS transistor and a CMOS transistor on the same semiconductor substrate.

One of the aspects of the present invention provides a manufacturing method of a semiconductor device including a DMOS transistor, an NMOS transistor, and a PMOS transistor arranged on a semiconductor substrate, the DMOS transistor including a first impurity region that is of the same conductivity type as a drain region and a source region of the DMOS transistor and has a lower impurity concentration than the drain region and the source region, and a second impurity region that is of a conductivity type opposite to the first impurity region, which are formed to be adjacent to each other in an upper surface of the semiconductor substrate, the first impurity region being formed to enclose the drain region, and the second impurity region being formed to enclose the source region, the manufacturing method of the semiconductor device, comprising a first step of forming the first impurity region at the same time as a well of one of the NMOS transistor and the PMOS transistor, and a second step of forming the second impurity region at the same time as a well of the other of the NMOS transistor and the PMOS transistor.

Further features of the present invention will become apparent from the following description of exemplary embodiments with reference to the attached drawings.

BRIEF DESCRIPTION OF THE DRAWINGS

FIG. 1 is a sectional view for explaining an example of the structure of a semiconductor device including a DMOS transistor and a CMOS transistor on the same semiconductor substrate;

FIG. 2 is a sectional view for explaining an example of the structure of the DMOS transistor;

FIGS. 6A to 6C are sectional views for explaining an example of a manufacturing method of the semiconductor device;

FIGS. 7A to 7C are sectional views for explaining an example of the manufacturing method of the semiconductor device;

FIGS. 8A to 8C are sectional views for explaining an example of the manufacturing method of the semiconductor device;

DESCRIPTION OF THE EMBODIMENTS

Figure 10A:
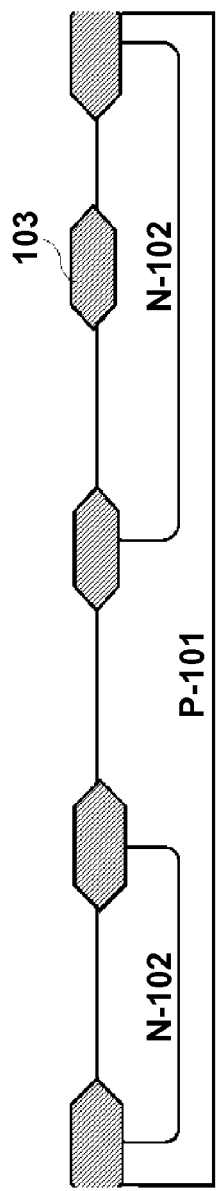
FIGS. 10A to 10D are sectional views for explaining a reference example of the manufacturing method.
Figure 10B:
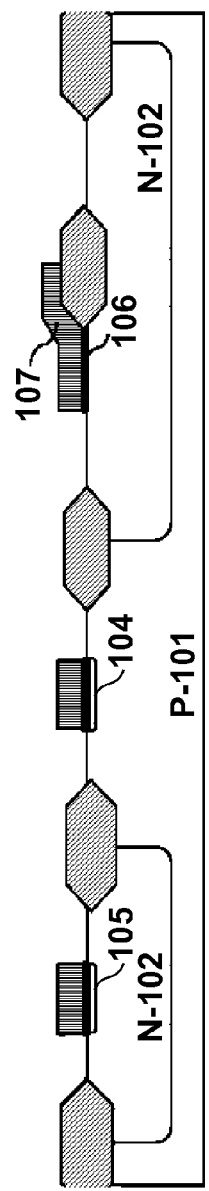
Figure 10C:
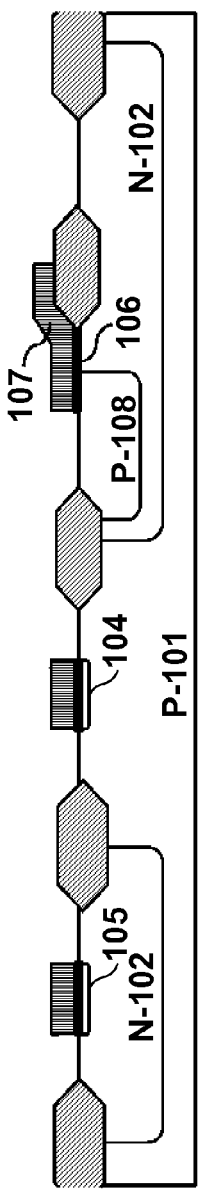
Figure 10D:
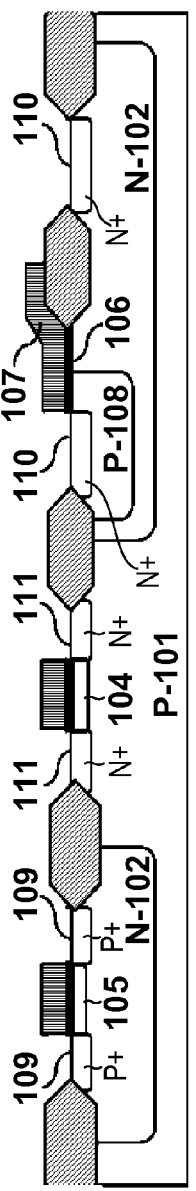

Prior to a description of a manufacturing method according to this embodiment for a semiconductor device including a DMOS transistor and a CMOS transistor on the same semiconductor substrate, a reference example of the manufacturing method will be described with reference to FIGS. 10A to 10D. An re-channel DMOS transistor, an NMOS transistor, and a PMOS transistor are illustrated. First, as shown in FIG. 10A, an n-type well 102 is formed in a region of a p-type semiconductor substrate 101 where the PMOS transistor is to be formed. Field oxide regions 103 are formed by selectively oxidizing desired regions. As shown in FIG. 10B, channel doped layers 104 and 105 configured to adjust the threshold voltages of the NMOS and PMOS transistors are formed. After that, a gate oxide film 106 having a film thickness of, for example, 60 nm is formed. In addition, gate electrodes 107 of polysilicon are formed. As shown in FIG. 10C, a p-type impurity region 108 for providing the channel of the DMOS transistor is formed. This region can be formed by ion-implanting a p-type impurity and annealing (for example, at 1,100° C. for about 180 min) by a self aligning technique using the gate electrode 107 as a mask. Finally, as shown in FIG. 10D, a p-type impurity is ion-implanted into the region where the PMOS transistor is to be formed, thereby forming source and drain regions 109. Next, an n-type impurity is ion-implanted into the region where the NMOS transistor is to be formed and the region where the DMOS transistor is to be formed, thereby forming source and drain regions 110 and 111.

In addition to the increase in the man-hours necessary to form the semiconductor regions, this manufacturing method has, for example, the following problems. Since the p-type impurity region 108 to provide the channel of the DMOS transistor is formed after formation of the gate oxide film 106 and the gate electrodes 107, the annealing is performed at a high temperature for a long time. For this reason, the impurities in the channel doped layers 104 and 105 of the NMOS transistor and the PMOS transistor are diffused by this annealing, and the threshold voltages are difficult to control. Especially in the NMOS and PMOS transistors having a short gate length (for example, 1 μm or less), the channel doping impurity profile spreads upon the annealing, and the leakage current increases. In addition, the impurity in the gate electrode 107 diffuses into the channel through the gate oxide film upon the annealing, and the same problem may arise. As described above, it is not easy to form the DMOS transistor and the CMOS transistor on the same semiconductor substrate.

A semiconductor device according to this embodiment will be described below with reference to FIGS. 1 to 5. FIG. 1 is a sectional view of a semiconductor device including an n-channel DMOS transistor, an NMOS transistor, and a PMOS transistor on the same semiconductor substrate. The DMOS transistor includes a source region 209, a drain region 210, and a first impurity region 202a (drift diffusion layer) of the DMOS transistor on, for example, a p-type semiconductor substrate 201. The conductivity type of the first impurity region 202a is an n type, like the drain region 210 and the source region 209. The impurity concentration of the first impurity region 202a is lower than that of the drain region 210 and the source region 209. The DMOS transistor also includes a second impurity region 203a (channel diffusion layer) that provides a channel. The conductivity type of the second impurity region 203a is a p type, opposite to the first impurity region. The DMOS transistor also includes insulation portions (first and second insulation portions 206 and 208) and a gate electrode 207a. The first impurity region 202a and the second impurity region 203a are formed in the upper surface of the semiconductor substrate 201 so as to be adjacent to each other. The first impurity region 202a is formed to enclose the drain region 210, and the second impurity region 203a is formed to enclose the source region 209. In the second impurity region 203a, an inversion region is generated in the interface to the insulation portion, that is, a channel through which electrons can move is formed in the interface in accordance with the bias applied to the gate electrode 207a. In the first impurity region 202a, the electrons that have moved through the channel formed in the second impurity region 203a can drift toward the drain region 210 based on the electric field. This electric field is generated by the impurity concentration difference between the first impurity region 202a and the drain region 210. The insulation portions 206 and 208 are arranged on the semiconductor substrate 201 between the source region 209 and the drain region 210. The gate electrode 207a is arranged on the insulation portions (first and second insulation portions 206 and 208). The first impurity region 202a includes, between the second impurity region 203a and the drain region 210, a first region R1 arranged on the side of the second impurity region 203a and a second region R2 arranged on the side of the drain region 210. The first insulation portion 206 is formed on the first region R1 and the second impurity region 203a. The second insulation portion 208 is thicker than the first insulation portion 206 formed on the second region R2. FIG. 1 illustrates the NMOS and PMOS transistors together with the DMOS transistor.

The first impurity region 202a of the DMOS transistor is formed in the same process (first process) as that of the well (in this case, a diffusion region 202b) of one of the NMOS and PMOS transistors. Hence, the first impurity region 202a and the diffusion region 202b are formed to the same depth at the same impurity concentration. The second impurity region 203a of the DMOS transistor is formed in the same process (second process) as that of the well (in this case, a diffusion region 203b) of the other of the NMOS and PMOS transistors. Hence, the second impurity region 203a and the diffusion region 203b are formed to the same depth at the same impurity concentration. The first insulation portion 206 of the DMOS transistor is formed in the same process (third process) as that of the gate insulating films of the NMOS and PMOS transistors. Hence, the first insulation portion 206 and the gate insulating films of the NMOS and PMOS transistors are formed to the same thickness (for example, 20 nm or less). The PMOS transistor includes a gate electrode 207b and diffusion regions 211 and 212. The NMOS transistor includes a gate electrode 207c diffusion regions 213 and 214. The gate length of the NMOS and PMOS transistors is, for example, 1.0 µm or less. "Same depth", "same impurity concentration", and "same thickness" above do not include differences by manufacturing variations.

The second insulation portion 208 can be formed by, for example, field oxidation, as will be described later. The gate electrode 207a is partially arranged on the second insulation portion 208. A channel doped layer 204a configured to adjust the threshold voltage of the DMOS transistor is formed in a region of the second impurity region 203a under the gate electrode 207a. A channel doped layer 204b configured to adjust the threshold voltage of the NMOS transistor is formed in a region of the diffusion region 203b under the gate electrode 207c. A channel doped layer 205 configured to adjust the threshold voltage of the PMOS transistor is formed in a region of the diffusion region 202b under the gate electrode 207b.

Figure 3:
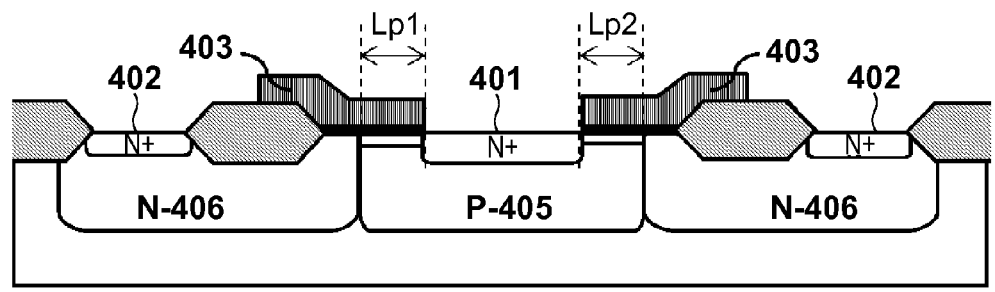
FIG. 3 is a sectional view for explaining another example of the structure of the DMOS transistor.

As for the structure of the DMOS transistor, one of the source and drain regions is sandwiched by the other of the source and drain regions. For example, as shown in FIG. 2, source regions 302 can be arranged to sandwich a drain region 301. Alternatively, for example, as shown in FIG. 3, drain regions 402 can be arranged to sandwich a source region 401. With this structure, when the mask position shifts in the manufacturing process, one of the effective channel lengths Lp1 and Lp2 for the DMOS transistor increases, and the other decreases, though the total sum of Lp1 and Lp2 does not change. That is, this can suppress the manufacturing variations of DMOS transistors in case of variations in mask alignment. Each of the effective channel lengths Lp1 and Lp2 represents the distance from the source region 302 (or 401) to the boundary between a first impurity region 306 (or 406) and a second impurity region 305 (or 405). If the effective channel lengths Lp1 and Lp2 are, for example, 0.5 µm or less, the variations in mask alignment conspicuously affect the leakage current or the like. Hence, the effective channel lengths Lp1 and Lp2 are set to, for example, 0.5 µm or more.

Figure 4:
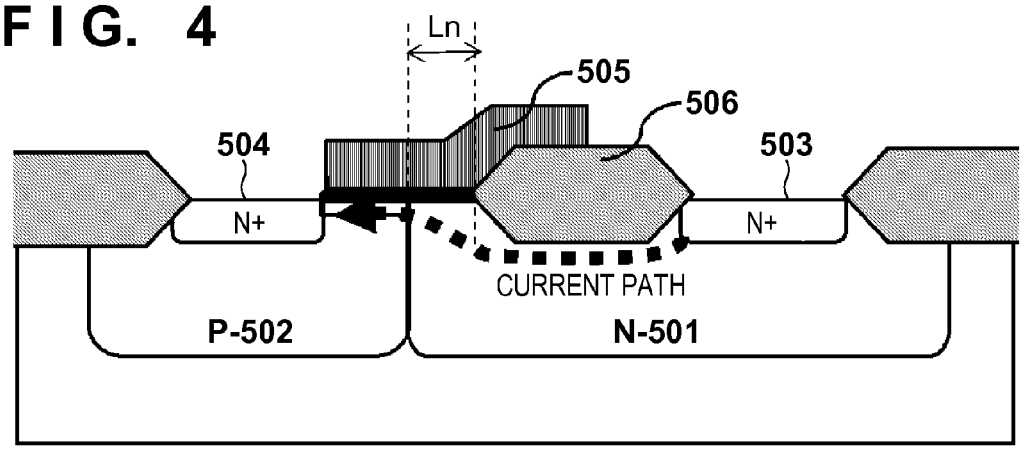
FIG. 4 is a sectional view for explaining an example of the operation of the DMOS transistor.
Figure 5:
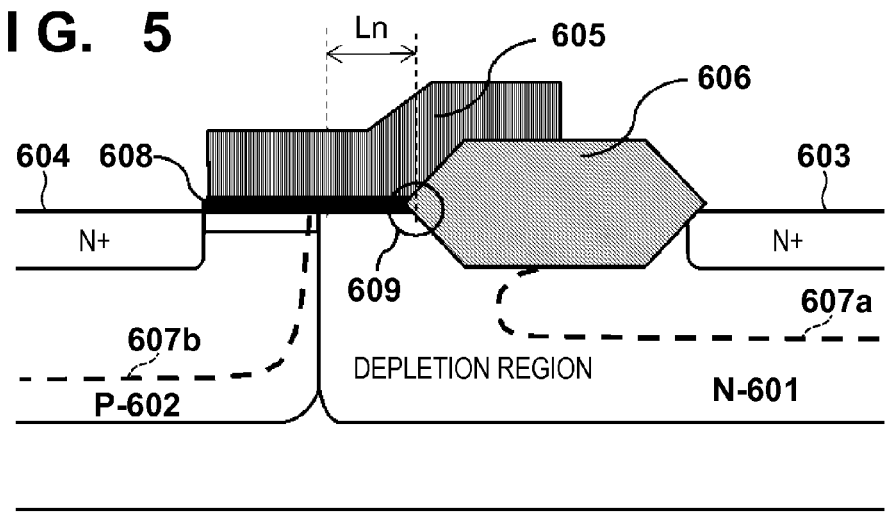
FIG. 5 is a sectional view for explaining an example of the operation state of the DMOS transistor.

A distance Ln from a second insulating layer 506 to the boundary between a first impurity region 501 and a second impurity region 502 shown in FIG. 4 is set within the range from, for example, 0.5 µm (inclusive) to 2.0 µm (inclusive). FIG. 4 shows the current path from a drain region 503 to a source region 504 when the DMOS transistor is driven. If Ln is smaller than, for example, 0.5 µm, the current path may narrow to lower the driving current amount. On the other hand, if Ln is larger than, for example, 2.0 µm, the drain-side breakdown voltage may lower in the DMOS transistor in the off state. FIG. 5 shows the depletion layer distribution when a voltage is applied to a drain region 603 of the DMOS transistor in the off state. A boundary 607a of the depletion layer is located in a region under a second insulation portion 606 when extended by voltage application. If Ln is large, the boundary 607a of the depletion layer does not extend to the region under the second insulation portion 606. The electric field may concentrate to the gate oxide film (region 609 in FIG. 5) at the field end and lower the breakdown voltage. To extent the boundary 607a of the depletion layer to the region under the second insulation portion 606, the impurity concentration of a first impurity region 601 is lowered. The impurity concentration of the first impurity region 601 is set to, for example, $8.0 \times 10^{16}$ [cm$^{-3}$] or less.

The manufacturing method of the semiconductor device according to this embodiment will be explained below with reference to FIGS. 6A to 9C. First, as shown in FIG. 6A, a silicon oxide film 702 is formed on a semiconductor substrate 701. In addition, an impurity 703 (for example, phosphorus) is implanted into the semiconductor substrate 701, thereby forming an n-type impurity layer 704. The thickness of the silicon oxide film 702 is, for example, about 100 nm. The impurity 703 is implanted at a dose of, for example, $5 \times 10^{12}$ [cm$^{-2}$].

As shown in FIG. 6B, a photoresist mask 705 is formed on the silicon oxide film 702 by patterning using photolithography. After that, an impurity 706 (for example, boron) is implanted into the semiconductor substrate 701 using the photoresist mask 705 as a mask, thereby forming a p-type impurity layer 707 in each region where a p-type diffusion region is to be formed. The impurity 706 is implanted at a dose of, for example, $1 \times 10^{13}$ [cm$^{-2}$]. At this time, the dose of the impurity 706 is, for example, twice the dose of the impurity 703. This allows to form p-type diffusion regions later in the regions where the impurity 706 (for example, boron) is implanted and form n-type diffusion regions later in the remaining regions.

As shown in FIG. 6C, the silicon oxide film 702 is etched using the photoresist mask 705 as a mask, and a thin oxide film 702a is formed after that. Next, a high-temperature diffusion process (for example, at 1,100° C. for about 180 min) is performed to form n-type diffusion regions 708 (or n-type wells) and p-type diffusion regions 709 (or p-type wells).

Next, as shown in FIG. 7A, for example, a silicon nitride film is formed on the entire surface, and photolithography and etching are performed to form a silicon nitride film 710 at each portion to be changed to an active region. After that, an impurity 711 (for example, boron) to form a channel stopper layer 714 later is implanted into the semiconductor substrate 701, thereby forming an impurity layer 712 in each p-type diffusion region 709. The impurity 711 is implanted at a dose of, for example, $1 \times 10^{14}$ [cm$^{-2}$]. At this time, implantation of the impurity 711 into the n-type diffusion regions 708 is prevented using, for example, a photoresist mask (not shown) or the mask of the silicon oxide film 702.

As shown in FIG. 7B, a field oxide film 713 having a film thickness of, for example, about 900 nm is selectively formed at a predetermined position by, for example, hydrogen burning oxidation. At this time, the impurity layer 712 is diffused to form the channel stopper layer 714.

As shown in FIG. 7C, a channel doping impurity 715 (for example, boron) is implanted into the semiconductor substrate 701 to adjust the threshold voltages of the DMOS transistor and the NMOS transistor. A channel doped impurity layer 716 is thus formed in each p-type diffusion region 709. The impurity 715 is implanted at a dose of, for example, $1 \times 10^{12}$ [cm$^{-2}$]. At this time, implantation of the impurity 715 into the n-type diffusion regions 708 is prevented using, for example, a photoresist mask (not shown) or the mask of the silicon oxide film 702.

As shown in FIG. 8A, a channel doping impurity 717 (for example, boron) is implanted into the semiconductor substrate 701 to adjust the threshold voltage of the PMOS transistor. A channel doped impurity layer 718 is thus formed in a corresponding one of the n-type diffusion regions 708. The impurity 717 is implanted at a dose of, for example, $1 \times 10^{12}$ [cm$^{-2}$]. At this time, implantation of the impurity 717 into the p-type diffusion regions 709 is prevented using, for example, a photoresist mask (not shown) or the mask of the silicon oxide film.

As shown in FIG. 8B, the silicon oxide film 702 is removed. After that, a gate oxide film 719 having a film thickness of about 10 nm is formed by, for example, hydrogen burning oxidation.

As shown in FIG. 8C, a polysilicon film having a film thickness of about 300 nm is formed by, for example, LPCVD (Low Pressure Chemical Vapor Deposition). The resistance value of the polysilicon film may be changed by doping, for example, phosphorus at the same time as the formation of the polysilicon film by LPCVD. Alternatively, the resistance value may be changed by doping, for example, phosphorus using, for example, an ion implantation method or a solid phase diffusion method after the formation of the polysilicon film. Then, a photolithography process and an etching process are performed to form gate electrodes 720 of polysilicon.

Figures 9A, 9B, 9C:
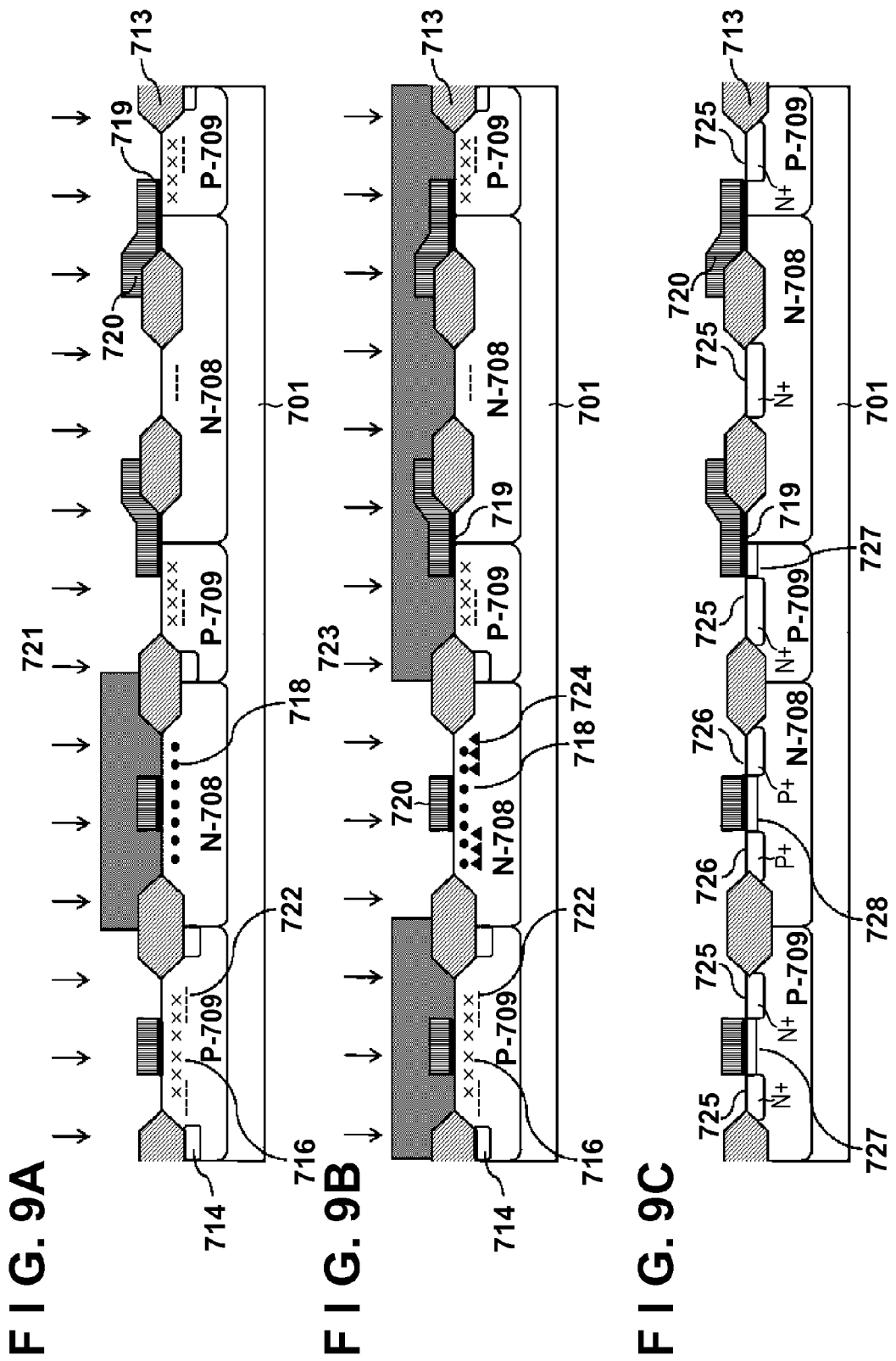
FIGS. 9A to 9C are sectional views for explaining an example of the manufacturing method of the semiconductor device.

As shown in FIG. 9A, a photoresist mask is formed by patterning using photolithography. After that, an n-type impurity 721 (for example, arsenic) is implanted into the semiconductor substrate 701 through the opening portions of the photoresist mask at a dose of, for example, $5 \times 10^{15}$ [cm$^{-2}$]. Impurity layers 722 are thus formed in regions where n-type source and drain regions 725 are to be formed later.

Similarly, as shown in FIG. 9B, a photoresist mask is formed by patterning using photolithography. After that, a p-type impurity 723 (for example, boron) is implanted into the semiconductor substrate 701 through the opening portions of the photoresist mask at a dose of, for example, $1.5 \times 10^{15}$ [cm$^{-2}$]. Impurity layers 724 are thus formed in regions where p-type source and drain regions 726 are to be formed later.

Finally, annealing is performed (for example, at 900° C. for about 10 min) to thermally diffuse the impurities of the channel doped impurity layers 716 and 718 and the impurity layers 722 and 724. Channel doped regions 727 of the DMOS transistor and the NMOS transistor and a channel doped region 728 of the PMOS transistor are thus formed, as shown in FIG. 9C. In addition, the n-type source and drain regions 725 and the p-type source and drain regions 726 are formed.

According to the above-described method, man-hour can be reduced, and the semiconductor device including the DMOS transistor and the CMOS transistor on the same semiconductor substrate can advantageously be manufactured. In this manufacturing method, the processes are commonly used to form the transistors. For this reason, after the formation of the channel doped impurity layers 716 and 718 (FIG. 8A), annealing is not performed for a long time at a high temperature more than, for example, 1,000° C. This allows to suppress the change in the impurity profile of the channel doped impurity layers 716 and 718 by thermal diffusion, that is, suppress the change in the characteristic of each transistor during the manufacturing process.

The above-described embodiment is not limited to this. The object, state, application purpose, function, and other specifications can be changed as needed, and implementation by other embodiments is also possible, as a matter of course. For example, the n-type semiconductor regions or diffusion regions and the p-type semiconductor regions or diffusion regions may be replaced with each other. In the embodiment, a case in which the DMOS transistor is an NMOS transistor has been described. However, the DMOS transistor may be a PMOS transistor. In this case, the first impurity region is formed in the same process as that of the p-type well for providing the channel of the NMOS transistor. The second impurity region is formed in the same process as that of the n-type well for providing the channel of the PMOS transistor.

The above-described semiconductor device is usable in, for example, a printing apparatus. A printing apparatus includes an electrothermal transducer and a semiconductor device for driving the electrothermal transducer in its printhead. The semiconductor device for driving the electrothermal transducer can include a DMOS transistor that is driven by a high voltage and to make a large current flow and a logic CMOS transistor that controls the driving on the same semiconductor substrate. The printing apparatus is used as the output terminal of, for example, a copying machine, a facsimile apparatus, a word processor, or a computer, and can also include a liquid discharge apparatus used to manufacture, for example, a DNA chip, an organic transistor, or a color filter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-049717, filed Mar. 6, 2012, which is hereby incorporated by reference herein in its entirety.

What is claimed is:

1. A semiconductor device comprising:
a DMOS transistor, an NMOS transistor, and a PMOS transistor arranged on a semiconductor substrate,
wherein the DMOS transistor includes a drain region, a source region, a first impurity region formed in the semiconductor substrate to enclose the drain region, a second impurity region formed in the semiconductor substrate to enclose the source region, an insulation portion arranged on the semiconductor substrate between the source region and the drain region, and a gate electrode arranged on the insulation portion,
wherein the first impurity region and the second impurity region are formed to be adjacent to each other in an upper surface of the semiconductor substrate,
wherein the first impurity region includes a first portion and a second portion both arranged between the second impurity region and the drain region, the second portion being arranged between the first portion of the first impurity region and the drain region,
wherein the insulation portion includes a first insulation portion and a second insulation portion,
wherein the first insulation portion is formed on a part of the second impurity region and on the first portion of the first impurity region,
wherein the second insulation portion is formed on the second portion of the first impurity region and is thicker than the first insulation portion,
wherein the first impurity region has the same depth and same impurity concentration as a first well in which one of the NMOS transistor and the PMOS transistor is formed,
wherein the second impurity region has the same depth and same impurity concentration as a second well of in which the other of the NMOS transistor and the PMOS transistor is formed, and
wherein the first insulation portion has the same thickness as a gate insulating film of each of the NMOS transistor and the PMOS transistor.

2. The device according to claim 1, wherein one of the source region and the drain region is at least partially embedded in the other of the source region and the drain region.

3. The device according to claim 1, wherein the impurity concentration of the first impurity region is included in a range of equal to or less than $8.0 \times 10^{16}$ [cm$^{-3}$].

4. The device according to any claim 1, wherein a distance from the source region to a boundary between the first impurity region and the second impurity region is included in a range of equal to or more than 0.5 μm.

5. The device according to claim 1, wherein a distance from the second insulation portion to a boundary between the first impurity region and the second impurity region is included in a range from 0.5 μm (inclusive) to 2.0 μm (inclusive).

6. A printing apparatus comprising a semiconductor device described in claim 1.

7. The device according to claim 1, wherein the drain region has the same conductivity type as the first impurity region.

8. The device according to claim 1, wherein the first and second wells are formed in the semiconductor substrate.

9. The device according to claim 1, wherein the first impurity region has the same depth as the second impurity region.

10. The device according to claim 1, wherein the first insulation portion is contact with a part of the second impurity region and the first portion of the first impurity region.

11. The device according to claim 1, wherein the second insulation portion is contact with the second portion of the first impurity region.

12. A semiconductor device including a DMOS transistor, an NMOS transistor, and a PMOS transistor arranged on a semiconductor substrate, wherein
the DMOS transistor includes a drain region, a source region, a first impurity region formed to enclose the drain region, a second impurity region formed to enclose the source region, an insulation portion arranged on the semiconductor substrate between the source region and the drain region, and a gate electrode arranged on the insulation portion,
the first impurity region and the second impurity region are formed to be adjacent to each other in an upper surface of the semiconductor substrate,
the first impurity region includes, between the second impurity region and the drain region, a first portion arranged on a side of the second impurity region and a second portion arranged on a side of the drain region,
the insulation portion includes a first insulation portion formed on the first portion and the second impurity region, and a second insulation portion that is formed on the second portion and is thicker than the first insulation portion,
the first impurity region has the same depth and same impurity concentration as a first well in which one of the NMOS transistor and the PMOS transistor is formed,
the second impurity region has the same depth and same impurity concentration as a second well in which the other of the NMOS transistor and the PMOS transistor is formed, and
the first insulation portion has the same thickness as a gate insulating film of each of the NMOS transistor and the PMOS transistor, and
wherein a distance from the source region to a boundary between the first impurity region and the second impurity region is included in a range of equal to or more than 0.5 μm.

13. A semiconductor device including a DMOS transistor, an NMOS transistor, and a PMOS transistor arranged on a semiconductor substrate, wherein
the DMOS transistor includes a drain region, a source region, a first impurity region formed to enclose the drain region, a second impurity region formed to enclose the source region, an insulation portion arranged on the semiconductor substrate between the source region and the drain region, and a gate electrode arranged on the insulation portion,
the first impurity region and the second impurity region are formed to be adjacent to each other in an upper surface of the semiconductor substrate,
the first impurity region includes, between the second impurity region and the drain region, a first portion arranged on a side of the second impurity region and a second portion arranged on a side of the drain region, the insulation portion includes a first insulation portion formed on the first portion and the second impurity region, and a second insulation portion that is formed on the second portion and is thicker than the first insulation portion, the first impurity region has the same depth and same impurity concentration as a first well in which one of the NMOS transistor and the PMOS transistor is formed, the second impurity region has the same depth and same impurity concentration as a second well in which the other of the NMOS transistor and the PMOS transistor is formed, and the first insulation portion has the same thickness as a gate insulating film of each of the NMOS transistor and the PMOS transistor, and wherein a distance from the second insulation portion to a boundary between the first impurity region and the second impurity region is included in a range from 0.5 μm (inclusive) to 2.0 μm (inclusive).

* * * * *